(12) United States Patent
Jung

(10) Patent No.: US 7,688,647 B2
(45) Date of Patent: Mar. 30, 2010

(54) SEMICONDUCTOR MEMORY DEVICE WITH HIGH VOLTAGE GENERATOR

(75) Inventor: Ho-Don Jung, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 74 days.

(21) Appl. No.: 12/003,674

(22) Filed: Dec. 31, 2007

(65) Prior Publication Data

US 2008/0239835 A1    Oct. 2, 2008

(30) Foreign Application Priority Data

Mar. 31, 2007    (KR) .................... 10-2007-0032051

(51) Int. Cl.
*G11C 5/14*    (2006.01)

(52) U.S. Cl. ............ 365/189.09; 365/226; 365/189.11; 365/189.07

(58) Field of Classification Search ............ 365/189.09, 365/226, 189.11, 189.07
See application file for complete search history.

(56) References Cited

U.S. PATENT DOCUMENTS

| | | | | |
|---|---|---|---|---|
| 5,526,313 A | * | 6/1996 | Etoh et al. .................... | 365/205 |
| 5,568,440 A | * | 10/1996 | Tsukude et al. .............. | 365/222 |
| 5,587,958 A | * | 12/1996 | Kaneko et al. .......... | 365/230.06 |
| 5,689,460 A | * | 11/1997 | Ooishi .................... | 365/189.07 |
| 5,825,705 A | * | 10/1998 | Tsukude et al. .............. | 365/222 |
| 5,881,614 A | * | 3/1999 | Cheng-Tsan ................. | 81/438 |
| 6,079,023 A | | 6/2000 | Yoon et al. | |
| 6,483,357 B2 | * | 11/2002 | Kato et al. ................... | 327/143 |
| 6,563,746 B2 | * | 5/2003 | Fujioka et al. ......... | 365/189.09 |
| 6,778,460 B1 | | 8/2004 | Jung | |
| 6,891,773 B2 | | 5/2005 | Park | |
| 6,930,946 B2 | * | 8/2005 | Otsuka et al. ............... | 365/222 |
| 7,002,854 B2 | * | 2/2006 | Takahashi et al. ...... | 365/189.09 |
| 7,173,480 B2 | | 2/2007 | Kim et al. | |
| 2007/0025163 A1 | | 2/2007 | Partsch et al. | |

FOREIGN PATENT DOCUMENTS

| | | | |
|---|---|---|---|
| EP | 000647946 A2 | * | 4/1995 |
| JP | 411086544 A | * | 3/1999 |
| JP | 11-203876 | | 7/1999 |
| KR | 10-2003-0002813 A | | 1/2003 |
| KR | 10-2005-0101687 A | | 10/2005 |
| KR | 10-2006-0104399 A | | 10/2006 |

OTHER PUBLICATIONS

Korean Office Action issued in Korean Patent Application No. KR 10-2007-0032051, dated Jan. 6, 2009.
Korean Office Action, with English Translation, issued in Korean Patent Application No. KR 10-2007-0032051, dated Jul. 18, 2008.

* cited by examiner

*Primary Examiner*—Viet Q Nguyen
(74) *Attorney, Agent, or Firm*—IP & T Law Firm PLC

(57) ABSTRACT

A semiconductor memory device which prevents a drop of the level of an external voltage due to generation of high voltage, thereby ensuring an effective data window. The semiconductor memory device includes a level detecting unit and a voltage generating unit. The level detecting unit is configured to detect a level of an internal voltage based on a reference voltage to output a level detection signal. The voltage generating unit is configured to generate the internal voltage by selectively pumping an external voltage according to the level detection signal and a refresh signal.

14 Claims, 7 Drawing Sheets

SEMICONDUCTOR MEMORY DEVICE WITH HIGH VOLTAGE GENERATOR

CROSS-REFERENCE TO RELATED APPLICATIONS

This application claims priority to Korean patent application number 10-2007-0032051, filed on Mar. 31, 2007, which is incorporated by reference in its entirety.

BACKGROUND OF THE INVENTION

The subject matter relates to semiconductor design technology, and more particularly to a high speed semiconductor memory device for preventing a drop of the level of an external voltage due to generation of high voltage to thereby ensure an effective data window.

FIG. 1 is a block diagram illustrating a conventional semiconductor memory device.

Referring to FIG. 1, the semiconductor memory device includes a plurality of data pads 10, a data controller 20, a plurality of banks 30, and a plurality of high voltage generators 40 and 50. The data pads for a data input/output are disposed in a central region, each of which is composed by 8 bits. As illustrated the data pads are total 4 bytes. The data controller 20 receives an external voltage, generates a data clock, and controls data, which is output to the data pads, by using the data clock. The banks corresponding to each data pad are disposed above or below the respective data pad. One high voltage generator is provided for each bank in order to generate a high voltage VPP to be consumed by the bank.

As illustrated in FIG. 1, the data controller 20 and the data pads are disposed in a peripheral region of the semiconductor memory device.

FIG. 2 is a block diagram of the conventional high voltage generator 50.

Referring to FIG. 2, the high voltage generator 50 includes a level detecting unit 52, a first voltage generating unit 54, and a second voltage generating unit 56. The level detecting unit 52 detects a level of a high voltage VPP with respect to a reference voltage VREF to output a level detection signal PPEA. The first and the second voltage generating units 54 and 56 generate the high voltage VPP by charge-pumping an external voltage VDD periodically in response to the level detection signal PPEA.

Each of the voltage generating units 54 and 56, for example, the first voltage generating unit 54, includes an oscillation signal generator 54A and a high voltage pump 54B. The oscillation signal generator 54A generates an oscillation signal OSC having a predetermined period in response to the level detection signal PPEA. The high voltage pump 54B generates a high voltage VPP having a voltage level higher than the external voltage VDD by charge-pumping the external voltage VDD during an activation period of the oscillation signal OSC.

As illustrated in FIG. 2, the first and the second voltage generating units 54 and 56 share the level detecting unit 52 and are driven according to the level detection signal PPEA. However, each of the voltage generating units 54 and 56 can have separate level detecting units. In this case, the voltage generating units 54 and 56 operate as they do with a shared level detecting unit 52.

The operation of the voltage generating unit 54 will be described below.

The level detecting unit 52 activates the level detection signal PPEA when a level of the high voltage VPP is lower than a level of the reference voltage VREF. The oscillation signal generator 54A generates the oscillation signal OSC having a predetermined period during the activation period of the level detection signal PPEA. The high voltage pump 54B pumps the external voltage VDD during the activation period of the oscillation signal OSC, and generates a high voltage VPP having a voltage level higher than the external voltage VDD. When the oscillation signal generator 54A and the high voltage pump 54B are driven, the second voltage generating unit 56 is driven simultaneously to generate the high voltage VPP.

The above described process is repeated until the level of the high voltage VPP reaches the level of the reference voltage VREF.

The high voltage VPP is generated by charge-pumping the external voltage VDD, and the charge-pumping process makes up about 30% of a total external voltage consumption in the semiconductor memory device. Thus, when the high voltage VPP is generated, the level of the external voltage VDD drops. Such a drop will be described with reference to FIG. 3.

FIG. 3 is a signal timing diagram illustrating changes of an external voltage VDD and a data clock DT_CLK according to a driving of the high voltage generator of FIG. 2.

Referring to FIG. 3, when a level detection signal PPEA is activated, the high voltage pump 54B is driven to generate a high voltage VPP such that the external voltage VDD is consumed, and a level of the external voltage VDD drops.

Noise components, such as the drop of the level of the external voltage VDD, affect the data controller 20 driven by using the external voltage VDD as a driving voltage. For example, the amplitude of the data clock DT_CLK decreases and the duty cycle is distorted from 50% to 55%.

When the duty cycle of the data clock DT_CLK is distorted, since data are irregularly transferred to the data pad, time intervals between data packet arrivals become irregular. Due to the irregular time intervals, the size of an effective data window is reduced and the voltage generating unit abnormally operates at high data clock frequencies.

The high voltage generator 50, disposed between the banks 30, is a significant cause of the above described effect, because the data controller 20 disposed in a central region of the semiconductor memory device is closer to the high voltage generator 50 than the high voltage generator 40.

SUMMARY OF THE INVENTION

Embodiments of the present invention are directed to providing a high speed semiconductor memory device for preventing a drop of the level of an external voltage due to generation of high voltage to ensure an effective data window.

In one embodiment, a semiconductor memory device includes a level detecting unit configured to detect a level of an internal voltage based on a reference voltage to output a level detection signal, and a voltage generating unit configured to generate the internal voltage by selectively pumping an external voltage according to the level detection signal and a refresh signal.

In another embodiment, a semiconductor memory device includes a level detecting unit configured to detect a level of an internal voltage based on a reference voltage to output a level detection signal, a driving control unit configured to receive the level detection signal and a refresh signal to output a driving control signal, a first voltage pumping unit configured to generate the internal voltage by periodically charge-pumping an external voltage in response to the driving control signal, and a second voltage pumping unit configured to generate the internal voltage by periodically charge-pumping the external voltage in response to the level detection signal.

In still further embodiment, a semiconductor memory device includes a level detecting unit configured to detect a level of an internal voltage based on a reference voltage to output a level detection signal, an oscillation signal generating unit configured to generate an oscillation signal in response to the level detection signal and to adjust a period of the oscillation signal in response to a refresh signal, and a voltage pumping unit configured to generate the internal voltage by charge-pumping an external voltage during an activation period of the oscillation signal.

DESCRIPTION OF SPECIFIC EMBODIMENTS

Hereinafter, a semiconductor memory device including a high voltage circuit in accordance with embodiments of the present invention will be described in detail with reference to the accompanying drawings.

Figure 1:
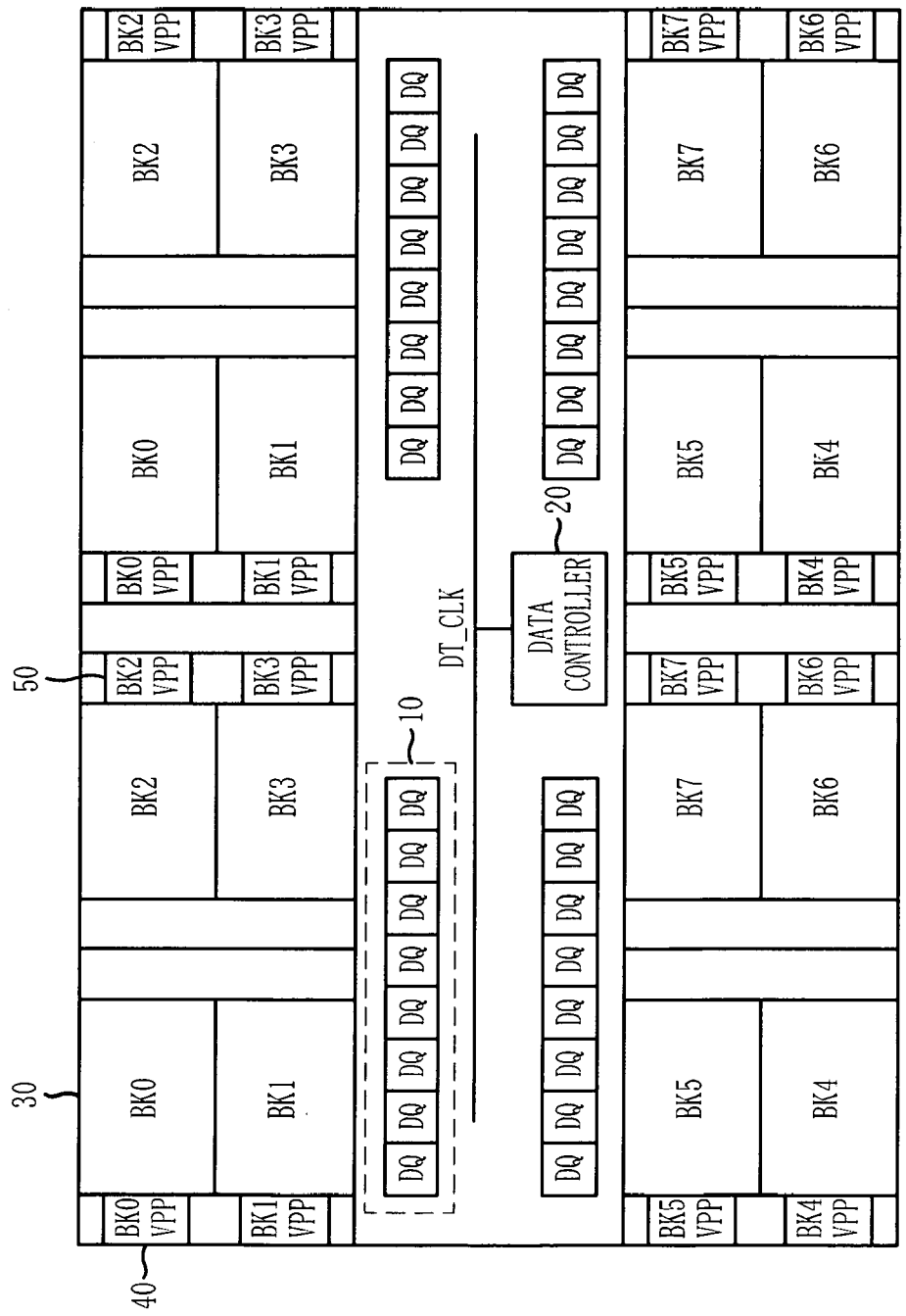
FIG. 1 is a block diagram illustrating a conventional semiconductor memory device.
Figure 2:
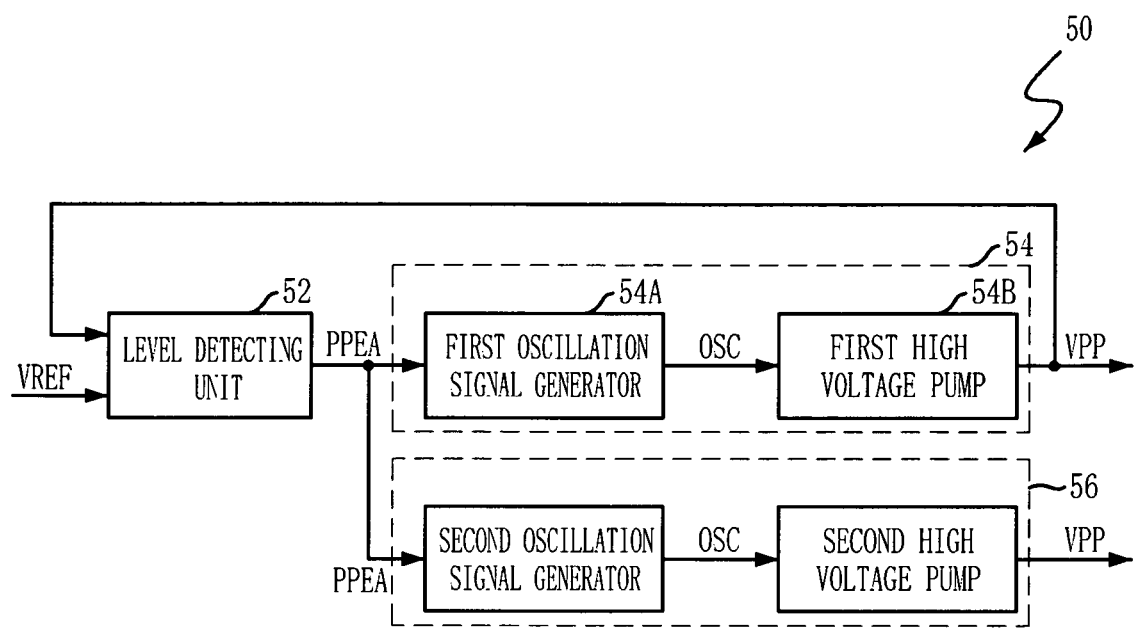
FIG. 2 is a block diagram of the conventional high voltage generator.
Figure 3:
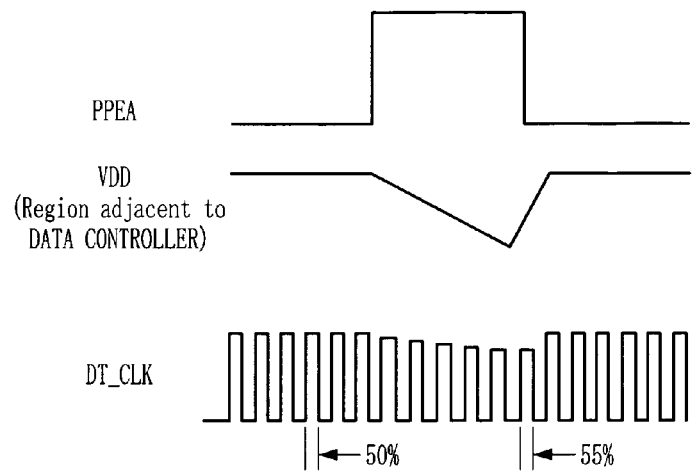
FIG. 3 is a signal timing diagram illustrating changes of an external voltage and a data clock according to a driving of the high voltage generator of FIG. 2.
Figure 4:
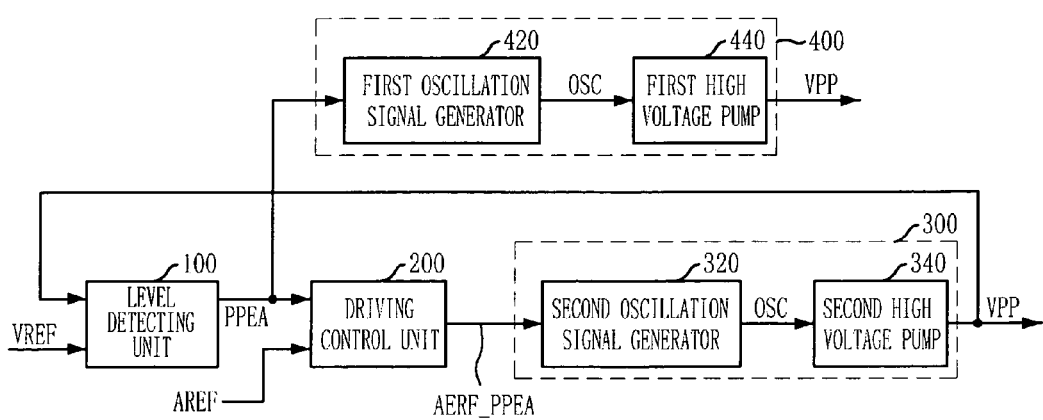
FIG. 4 is a block diagram illustrating a high voltage generator in a semiconductor memory device in accordance with a first embodiment of the present invention.

FIG. 4 is a block diagram illustrating a high voltage generator in a semiconductor memory device in accordance with a first embodiment of the present invention.

Referring to FIG. 4, the high voltage generator includes a level detecting unit 100, a driving control unit 200, a first voltage generating unit 300, and a second voltage generating unit 400. The level detecting unit 100 detects a level of a high voltage VPP with respect to a reference voltage VREF to output a level detection signal PPEA. The driving control unit 200 receives the level detection signal PPEA and a refresh signal AREF to generate a driving control signal AREF_PPEA. The first voltage generating unit 300 generates the high voltage VPP by charge-pumping an external voltage VDD periodically in response to the driving control signal AREF_PPEA. The second voltage generating unit 400 generates the high voltage VPP by charge-pumping the external voltage VDD periodically in response to the level detection signal PPEA.

The first voltage generating unit 300 includes an oscillation signal generator 320 and a high voltage pump 340. The oscillation signal generator 320 generates an oscillation signal OSC, typically having a predetermined period, in response to the driving control signal AREF_PPEA. The high voltage pump 340 generates a high voltage VPP having a voltage level higher than the external voltage VDD by charge-pumping the external voltage VDD during an activation period of the oscillation signal OSC.

The second voltage generating unit 400 includes an oscillation signal generator 420 and a high voltage pump 440. The oscillation signal generator 420 generates an oscillation signal OSC, typically having a predetermined period, in response to the level detection signal PPEA. The high voltage pump 440 generates a high voltage VPP having a voltage level higher than an external voltage VDD by charge-pumping the external voltage VDD during an activation period of the oscillation signal OSC.

Figure 5:
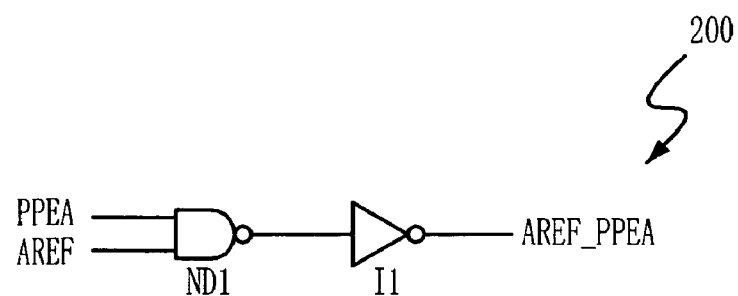
FIG. 5 is a schematic circuit diagram illustrating a driving control unit of FIG. 4.

FIG. 5 is a schematic circuit diagram illustrating the driving control unit 200 of FIG. 4.

Referring to FIG. 5, the driving control unit 200 includes a NAND gate ND1 and an inverter I1. The NAND gate ND1 receives a level detection signal PPEA and a refresh signal AREF. The inverter I1 is inverts an output signal of the NAND gate ND1 to output a driving control signal AREF_PPEA.

When the refresh signal AREF and the level detection signal PPEA are activated to a logic high level, the driving control unit 200 activates the driving control signal AREF_PPEA to a logic high level. When the refresh signal AREF or the level detection signal PPEA is inactivated to a logic low level, the driving control unit 200 inactivates the driving control signal AREF_PPEA to a logic low level.

Hereinafter, the operation of the high voltage generator in accordance with the embodiment is briefly described.

In the case of refresh operation, a refresh signal AREF is activated to a logic high level in response to a refresh command.

The level detecting unit 100 activates a level detection signal PPEA when a level of a high voltage VPP is lower than a level of a reference voltage VREF. The driving control unit 200 activates a driving control signal AREF_PPEA when the refresh signal AREF and the level detection signal PPEA are activated. The first voltage generating unit 300 generates a high voltage VPP by charge-pumping an external voltage VDD in response to activation of the driving control signal AREF_PPEA. The second voltage generating unit 400 generates a high voltage VPP by charge-pumping an external voltage VDD in response to activation of the level detection signal PPEA.

When a semiconductor memory device does not perform refresh operation, i.e. during normal operation, a refresh signal AREF is inactivated to a logic low level.

The level detecting unit 100 activates a level detection signal PPEA when a level of a high voltage VPP is lower than a level of a reference voltage VREF. The driving control unit 200 inactivates a driving control signal AREF_PPEA in response to inactivation of the refresh signal AREF. Thus, the first voltage generating unit 300 is not driven according to the inactivation of the driving control signal AREF_PPEA. The second voltage generating unit 400 generates a high voltage VPP by charge-pumping an external voltage VDD in response to the level detection signal PPEA.

The above described process is repeated until the level of the high voltage VPP reaches the level of the reference voltage VREF.

Thus, a high voltage generator in accordance with the embodiment includes a driving control unit 200. Also, during refresh driving, the first and the second voltage generating units 300 and 400 both are driven, and during normal driving, only the second voltage generating unit 400 is driven. During a refresh mode, consumption of the high voltage VPP is large, because all of banks are activated during an auto refresh mode, and both voltage generating units 300 and 400 are turned on to provide the required high voltage VPP. During normal driving, the consumption of the high voltage VPP is small, only the second voltage generating unit 400 is driven, and the consumption of the external voltage VDD due to driving of the voltage generating units 300 and 400 can be reduced. Thus, the highest value in the level drop of the external voltage VDD is reduced during normal driving, so that the level of the external voltage VDD is stably maintained.

Figure 6:
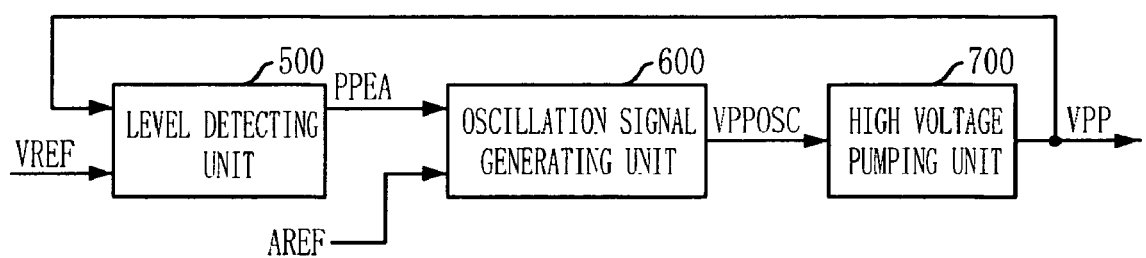
FIG. 6 is a block diagram illustrating a high voltage generator in accordance with a second embodiment of the present invention.

FIG. 6 is a block diagram illustrating a high voltage generator in accordance with a second embodiment of the present invention.

Referring to FIG. 6, the high voltage generator includes a level detecting unit 500, an oscillation signal generating unit 600, and a high voltage pumping unit 700. The level detecting unit 500 detects a level of a high voltage VPP with respect to a reference voltage VREF to output a level detection signal PPEA. The oscillation signal generating unit 600 generates an oscillation signal VPPOSC in response to the level detection signal PPEA, and adjusts a period of the oscillation signal VPPOSC in response to a refresh signal AREF. The high voltage pumping unit 700 generates a high voltage VPP having a voltage level higher than an external voltage VDD by charge-pumping the external voltage VDD during an activation period of the oscillation signal VPPOSC.

The high voltage generator in accordance with the second embodiment changes the period of the oscillation signal VPPOSC in response to the refresh signal AREF. Accordingly, in the case of normal driving in which the refresh signal AREF is inactivated, the period of the oscillation signal VPPOSC is lengthened, so that the number of drivings of the high voltage pumping unit 700 is reduced, thereby decreasing the consumption of the external voltage VDD.

Figure 7:
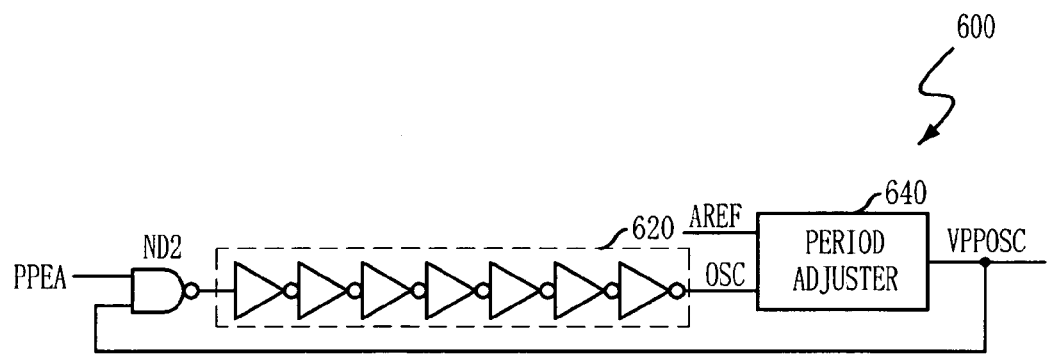
FIG. 7 is a schematic circuit diagram illustrating an oscillation signal generating unit of FIG. 6.

FIG. 7 is a schematic circuit diagram illustrating the oscillation signal generating unit 600.

Referring to FIG. 7, the oscillation signal generating unit 600 includes a NAND gate ND2, an inverter chain 620, and a period adjuster 640. The NAND gate ND2 receives the level detection signal PPEA and the oscillation signal VPPOSC. The inverter chain 620 delays and inverts an output signal of the NAND gate ND2 to output a pre-oscillation signal OSC. The period adjuster 640 selectively delays the pre-oscillation signal OSC in response to the refresh signal AREF to output the oscillation signal VPPOSC.

Figure 8:
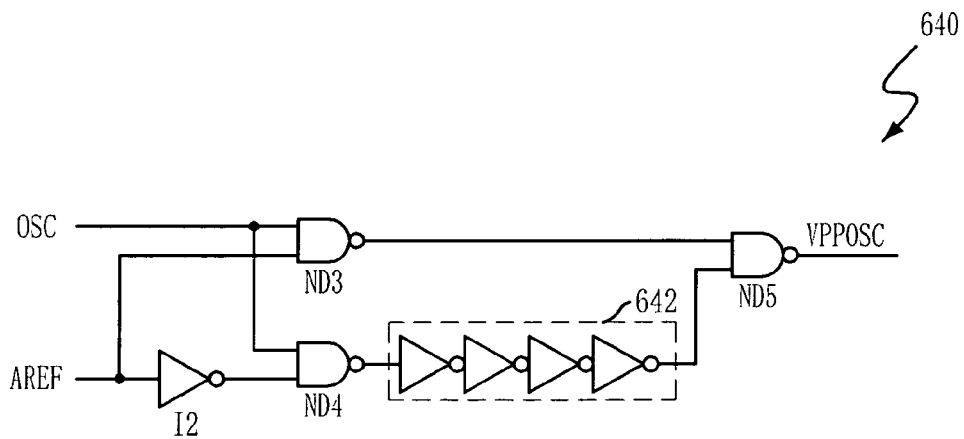
FIG. 8 is a schematic circuit diagram illustrating a period adjuster of FIG. 7.

FIG. 8 is a schematic circuit diagram illustrating the period adjuster 640.

Referring to FIG. 8, the period adjuster 640 includes a NAND gate ND3, an inverter I2, a NAND gate ND4, an inverter chain 642, and a NAND gate ND5. The NAND gate ND3 receives the refresh signal AREF and the pre-oscillation signal OSC. The inverter I2 inverts the refresh signal AREF. The NAND gate ND4 receives an output signal of the inverter I2 and the pre-oscillation signal OSC. The inverter chain 642 delays an output signal of the NAND gate ND4 for a predetermined time. The NAND gate ND5 receives an output signal of the inverter chain 642 and an output signal of the NAND gate ND3 to output the oscillation signal VPPOSC.

When a refresh signal AREF is activated to a logic high level, the period adjuster 640 outputs a pre-oscillation signal OSC as an oscillation signal VPPOSC without imparting an additional delay to the pre-oscillation signal OSC. When the refresh signal AREF is inactivated to a logic low level, the period adjuster 640 outputs an oscillation signal VPPOSC by imparting an additional delay caused by the inverter chain 642 to the pre-oscillation signal OSC.

From now on, the operation of the oscillation signal generating unit 600 will be described with reference to FIGS. 7 and 8.

During refresh driving in which a refresh signal AREF is activated, in response to an activation of a level detection signal PPEA, the NAND gate ND2 outputs an input signal and the inverter chain 620 delays the input signal to output an pre-oscillation signal OSC. In response to an activation of the refresh signal AREF, the period adjuster 640 outputs the pre-oscillation signal OSC as an oscillation signal VPPOSC without delaying the pre-oscillation signal OSC.

During normal driving in which a refresh signal AREF is inactivated, the NAND gate ND2 outputs an input signal in response to an activation of a level detection signal PPEA, and the inverter chain 620 delays the input signal to output an pre-oscillation signal OSC. In response to an inactivation of the refresh signal AREF, the period adjuster 640 outputs an oscillation signal VPPOSC by imparting an additional delay caused by the inverter chain 642 to the pre-oscillation signal OSC.

That is, in the high voltage generator in accordance with the second embodiment, during refresh driving the oscillation signal generating unit 600 generates an oscillation signal VPPOSC without separate delay. On the other hand, during normal driving, since an additional delay is imparted, the oscillation signal generating unit 600 generates an oscillation signal VPPOSC having a period longer than that of an oscillation signal VPPOSC generated during refresh driving. Thus, the number of drivings of the high voltage pumping unit 700 during normal driving is less than the number of drivings of the high voltage pumping unit 700 during refresh driving. During normal driving in which the consumption of a high voltage VPP is small, by reducing the number of drivings of the high voltage pumping unit 700, the consumption of an external voltage VDD by the high voltage pumping unit 700 can be reduced.

Figure 9:
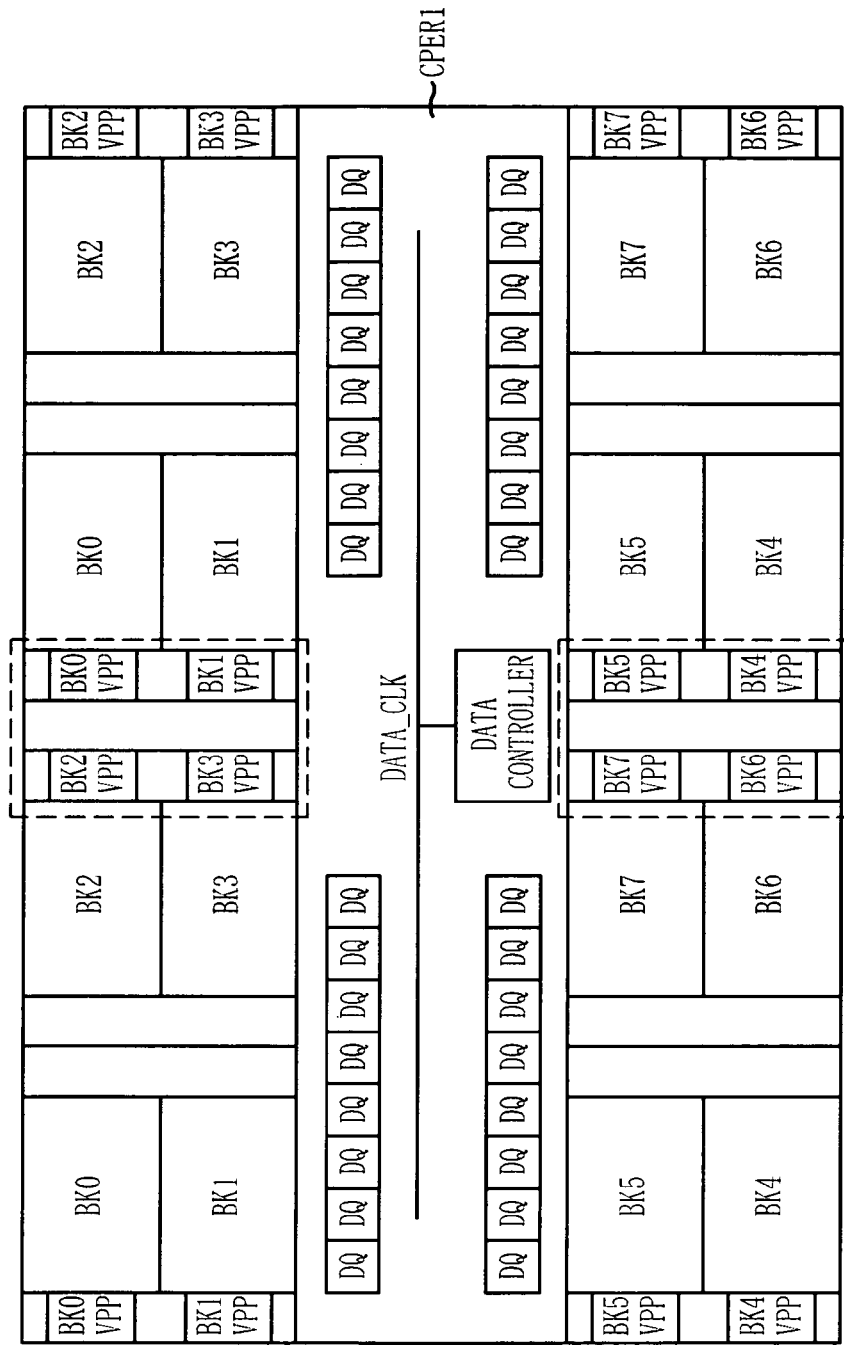
FIG. 9 is a block diagram illustrating a case in which a high voltage generator, in accordance with the disclosed embodiments, is applied to a semiconductor memory device.

FIG. 9 is a block diagram illustrating a case in which a high voltage generator in accordance with the disclosed embodiments is applied to a semiconductor memory device.

Referring to FIG. 9, the above-described operation control methods may be applied to high voltage generators disposed adjacent to a peripheral region, i.e., the part shown in dotted line, because a data controller is disposed in the peripheral region and high voltage generators disposed adjacent to the peripheral region affect a level of the external voltage VDD significantly.

Figure 10:
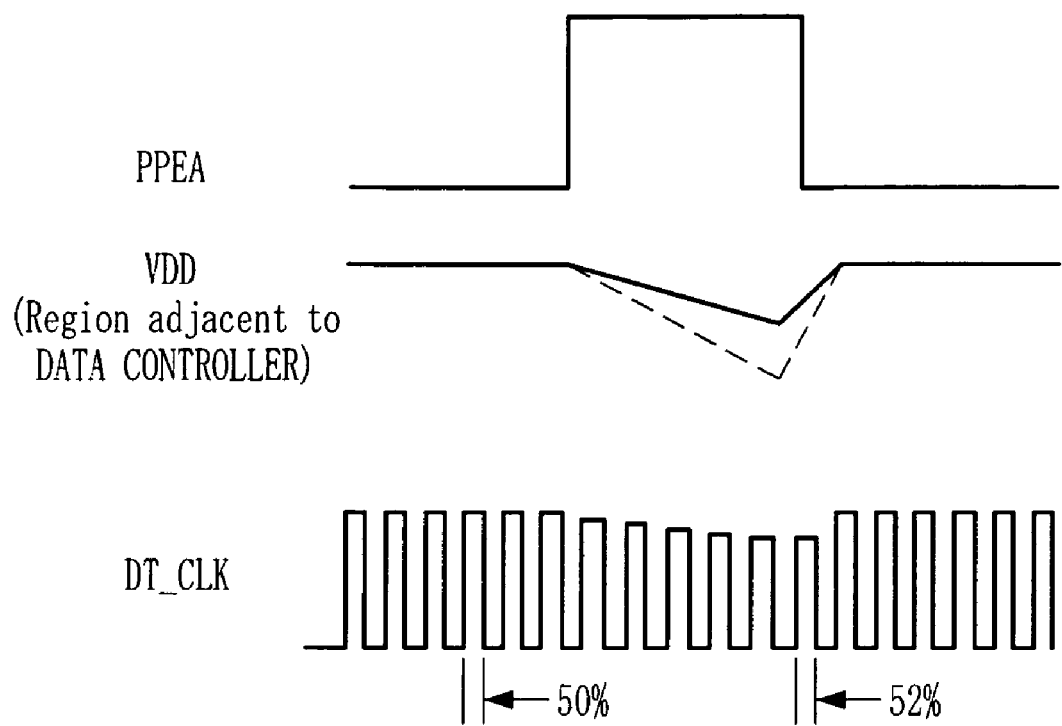
FIG. 10 is a signal timing diagram illustrating changes of an external voltage and a data clock when a high voltage generator in accordance with the disclosed embodiments is used.

FIG. 10 is a signal timing diagram illustrating changes of an external voltage VDD and a data clock DT_CLK when a high voltage generator in accordance with the disclosed embodiments is used. In FIG. 10, a level change of an external voltage VDD according to a conventional device is shown in dotted line, and a level change of an external voltage VDD according to the disclosed embodiments is illustrated with a solid line.

Referring to FIG. 10, although charge pumping occurs in response to an activation of a level detection signal PPEA, a level drop of the external voltage VDD is less than that experienced with a conventional device. This is because, during normal driving in which the consumption of a high voltage VPP is small, the consumption of the external voltage VDD due to driving of the high voltage pumping unit 700 of the second embodiment or the high voltage pumps 340 and 440 of the first embodiment is decreased by reducing the driving frequency of the high voltage pumping unit 700 or the number of driving high voltage pumps 340 and 440.

Since a noise component due to the level drop of the external voltage VDD is reduced, a data controller that receives the external voltage VDD generates the data clock DT_CLK stably.

Also, a noise component in a level of an external voltage due to consumption of the high voltage VPP is reduced, so that a duty cycle of a data clock generated by using the external voltage is more stably maintained. Accordingly, decrease of an effective data window due to distortion of a duty cycle is prevented, so that a required margin can be ensured even during high frequency operation.

As described above, the above embodiments, during normal driving, reduces the number of blocks driven or the frequency of drivings for generating a high voltage to reduce the level drop of the external voltage. As a result, a required effective data window can be ensured and a semiconductor memory device can operate more stably at high speed.

While the present invention has been described with respect to the disclosed embodiments, it will be apparent to those skilled in the art that various changes and modifications may be made without departing from the spirit and scope of the invention as defined in the following claims.

What is claimed is:

1. A semiconductor memory device, comprising:
   a level detecting unit configured to detect a level of an internal voltage based on a reference voltage to output a level detection signal; and
   a voltage generating unit configured to generate the internal voltage by selectively pumping an external voltage according to the level detection signal and a refresh signal,
   wherein the voltage generating unit includes:
      a driving control unit configured to receive the level detection signal and the refresh signal to output a driving control signal;
      a first voltage pumping unit configured to generate the internal voltage by periodically charge-pumping the external voltage in response to the driving control signal; and
      a second voltage pumping unit configured to generate the internal voltage by periodically charge-pumping the external voltage in response to the level detection signal.

2. The semiconductor memory device as recited in claim 1, wherein the first voltage pumping unit includes:
   an oscillation signal generating unit configured to generate an oscillation signal in response to the level detection signal and to adjust a period of the oscillation signal in response to the refresh signal; and
   a voltage pumping unit configured to generate the internal voltage, by charge-pumping the external voltage during an activation period of the oscillation signal.

3. The semiconductor memory device as recited in claim 1, wherein the internal voltage is a boosted voltage having a voltage level higher than the external voltage.

4. A semiconductor memory device, comprising:
   a level detecting unit configured to detect a level of an internal voltage based on a reference voltage to output a level detection signal;
   a driving control unit configured to receive the level detection signal and a refresh signal to output a driving control signal;
   a first voltage pumping unit configured to generate the internal voltage by periodically charge-pumping an external voltage in response to the driving control signal; and
   a second voltage pumping unit configured to generate the internal voltage by periodically charge-pumping the external voltage in response to the level detection signal.

5. The semiconductor memory device as recited in claim 4, wherein the first voltage pumping unit and the second voltage pumping unit are disposed adjacent to a peripheral region of the semiconductor memory device.

6. The semiconductor memory device as recited in claim 4, wherein the driving control unit includes:
   an NAND gate configured to receive the level detection signal and the refresh signal; and
   an inverter configured to input an output signal of the NAND gate and output the driving control signal.

7. The semiconductor memory device as recited in claim 4, wherein the first voltage pumping unit includes:
   a first oscillation signal generator configured to generate a first oscillation signal in response to the driving control signal;
   a first high voltage pump configured to generate the internal voltage, having a voltage level higher than the external voltage, by charge-pumping the external voltage during an activation period of the first oscillation signal.

8. The semiconductor memory device as recited in claim 7, wherein the second voltage generating unit includes:
   a second oscillation signal generator configured to generate a second oscillation signal in response to the level detection signal;
   a second high voltage pump configured to generate the internal voltage, having a voltage level higher than the external voltage, by charge-pumping the external voltage during an activation period of the second oscillation signal.

9. The semiconductor memory device as recited in claim 4, wherein the internal voltage is a boosted voltage having a voltage level higher than the external voltage.

10. A semiconductor memory device, comprising:
    a level detecting unit configured to detect a level of an internal voltage based on a reference voltage to output a level detection signal;
    an oscillation signal generating unit configured to generate an oscillation signal in response to the level detection signal and to adjust a period of the oscillation signal in response to a refresh signal; and
    a voltage pumping unit configured to generate the internal voltage, by charge-pumping an external voltage during an activation period of the oscillation signal.

11. The semiconductor memory device as recited in claim 10, wherein the oscillation signal generating unit includes:
    a first NAND gate configured to receive the level detection signal and the oscillation signal;
    a first inverter chain configured to delay and invert an output signal of the first NAND gate to output a pre-oscillation signal; and
    a period adjuster configured to selectively delay the pre-oscillation signal in response to the refresh signal to output the oscillation signal.

12. The semiconductor memory device as recited in claim 11, wherein the period adjuster includes:
    a second NAND gate configured to receive the refresh signal and the pre-oscillation signal;
    a first inverter configured to invert the refresh signal;
    a third NAND gate configured to receive an output signal of the first inverter and the pre-oscillation signal; and a second inverter chain configured to delay an output signal of the third NAND gate for a predetermined time; and a fourth NAND gate configured to receive an output signal of the second inverter chain and an output signal of the second NAND gate, to thereby output the oscillation signal.

13. The semiconductor memory device as recited in claim 10, wherein the voltage pumping unit is disposed adjacent to a peripheral region of the semiconductor memory device.

14. The semiconductor memory device as recited in claim 10, wherein the internal voltage is a boosted voltage having a voltage level higher than the external voltage.

* * * * *